United States Patent [19]

Rocha

[11] Patent Number: 4,528,502
[45] Date of Patent: Jul. 9, 1985

[54] CURRENT SENSOR

[75] Inventor: Henry A. F. Rocha, Schenectady, N.Y.

[73] Assignee: General Electric Company, Schenectady, N.Y.

[21] Appl. No.: 432,207

[22] Filed: Oct. 1, 1982

[51] Int. Cl.³ .......................................... G01R 19/00
[52] U.S. Cl. ................................ 324/117 R; 324/109
[58] Field of Search ................... 324/109, 117 R, 56; 310/311, 318

[56] References Cited

U.S. PATENT DOCUMENTS 3,997,839 12/1976 Dreyfus et al. ...................... 324/109

FOREIGN PATENT DOCUMENTS 52-16628   2/1977   Japan .................................. 324/109
53-148000 12/1978   Japan .................................. 310/311
55-44731   3/1980   Japan .................................. 310/311

OTHER PUBLICATIONS

Bajorek, C. H. et al, "A Permalloy Current Sensor", IEEE Transactions on Magnetics, vol. Mag. 12, No. 6, Nov. 1976.
Feng, J. S., "Dual Slope Magnetoresistive Current Sensor", IBM Technical Disclosure Bulletin, vol. 20, No. 2, Jul. 1977.

*Primary Examiner*—Stewart J. Levy
*Assistant Examiner*—Stephen M. Baker
*Attorney, Agent, or Firm*—Geoffrey H. Krauss; James C. Davis, Jr.; Marvin Snyder

[57] ABSTRACT

A current sensor, integratable with power switching and control circuitry on a common substrate and insulatable from current-carrying conductors, utilizes a piezoelectric element located between a pair of current-carrying conductors. The conductors carry a current flowing in the same direction, causing an attractive force therebetween to act upon the piezoelectric element and generate a voltage therein proportional to the square of the conductor currents. Use of a pair of sensors, each in a different portion of a half-bridge circuit, and associated electronics for providing a sensor output proportional to the instantaneous value of the sensed current, is also described.

14 Claims, 10 Drawing Figures

CURRENT SENSOR

BACKGROUND OF THE INVENTION

The present application relates to current sensors and, more particularly, to a novel current sensor which is integratable with power switching control circuitry on a common substrate, while being insulated from current-carrying conductors.

It is well known to sense the magnitude of a flowing current by means of a current shunt or a current transformer, both of which components are relatively expensive, relatively bulky and are non-integratable with any associated electronic circuitry. It is desirable to provide a current sensor which has a manufacturing cost much lower than the current shunt or current transformer approach which is presently utilized, yet which still provides isolation from the conductor in which flows the current to be sensed, and also provides for easy interfacing with power switching and control circuitry.

Alternatives to current shunt or current transformer sensors have been proposed. One proposed alternative, described by A. J. Rogers in "Optical Technique for Measurement of Current at High Voltage", (Proceedings of IEE (Britain), 1973, Vol. 120, pp. 261-267), utilizes the Faraday rotation of linearly-polarized light under a magnetic field for the measurement of current flow on high voltage lines. Another alternative sensor, proposed by A. Yariv and H. V. Winson in "Proposal for Detection of Magnetic Field through Magnetostrictive Perturbation of Optical Fibers" (Optical Letters, 1980, Vol. 5, pp. 83-87), uses an optical fiber clad by a magnetostrictive material, such as nickel, with the magnetic field produced by a current-carrying conductor causing a strain in the fiber and effecting the phase-delay of a laser beam propagated along the fiber; an interferometric arrangement measures the phase delay and provides an indication of current flow, as described by A. Dandridge et al. in "Interferometric Current Sensors using Optical Fibers" (Electronic Letters, 1981, Vol. 17, pp. 523 and 524). Both the Faraday rotation and magnetostrictive-optical fiber approaches are relatively expensive and non-integratable with associated electronics. R. C. Gallagher and W. S. Corak have proposed, in "A Metal-Oxide-Semiconductor (MOS) Hall Element" (Solid State Electronics, 1966, Vol. 9, pp. 571-580), combining an MOS structure with a Hall-effect element for current measurement, but such devices have not been offered in the commercial marketplace and may well be too difficult to fabricate on a cost-effective basis.

BRIEF SUMMARY OF THE INVENTION

In accordance with the invention, a sensor for providing an output proportional to the magnitude of a current flowing therethrough utilizes a piezoelectric element operated upon by the attractive force produced between two parallel current-carrying conductors. The linear piezoelectric element, positioned between the two conductors, provides an output voltage proportional to the square of the current flow, with a proportionality constant related to the physical dimensions of the piezoelectric element and of the parallel conductors. Insulative elements between the piezoelectric element and the parallel conductors serve to establish several of the proportionality factors, as well as to isolate the current-carrying conductors from the sensing element.

In a presently preferred embodiment, the current-carrying conductors are deposited as metallization patterns on a substrate, which may include associated electronic circuitry.

In another presently preferred embodiment, a sensor output voltage proportional to the current, rather than the square of the current, is provided by utilization of two sensors, each operating in one side of a half-bridge configuration with rectifying elements connected in series therewith. Square-root conversion circuitry is utilized to provide a circuit output voltage proportional to the instantaneous value of total current, in a fully integratable sensor.

Accordingly, it is an object of the present invention to provide a current sensor which is integratable with electronic circuitry on a common substrate, while having a sensing element insulated from the sensor current-carrying conductors.

DETAILED DESCRIPTION OF INVENTION

Figure 1:
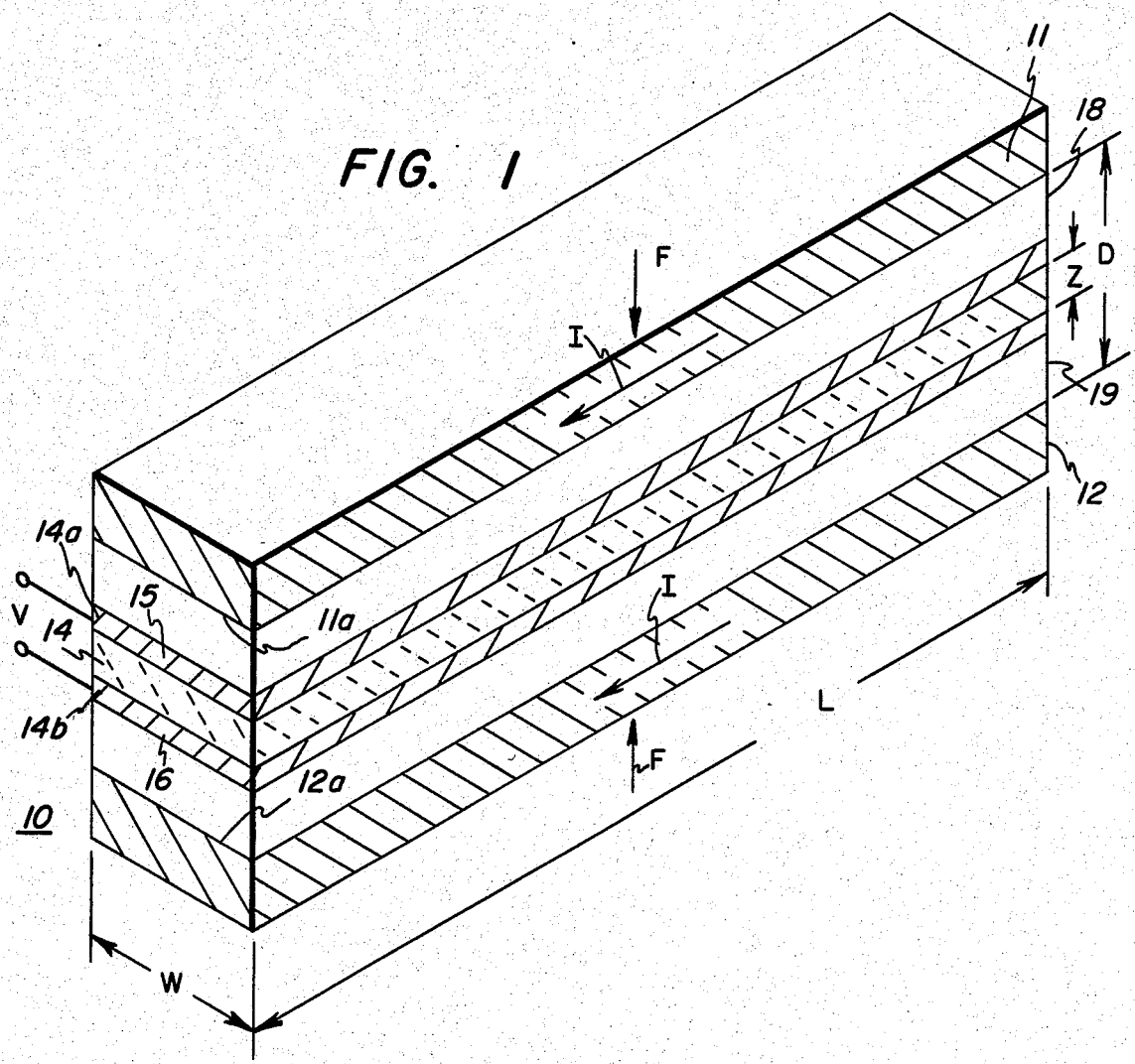
FIG. 1 is a perspective view of a current sensor in accordance with the principles of the present application.

Referring initially to FIG. 1, my novel current sensor 10 utilizes a pair of substantially parallel conductors 11 and 12. An A.C. current I, having an instantaneous value to be measured, is caused to flow in the same direction through each of the pair of conductors. The facing conductor surfaces 11a and 12a are spaced from one another by a separation distance D; each conductor has a length L. A linear piezoelectric element 14 is positioned between the pair of conductors. Element 14 is also of length L and of width W, with an element thickness Z. A conductive electrode 15 or 16 is fabricated upon each of the piezoelectric element surfaces 14a or 14b facing one of the current-carrying conductors 11 or 12, respectively. A rigid insulative member 18 or 19 positioned between the associated surface electrode 15 or 16 and the interior-facing surface 11a or 12a of the associated conductor, to insulate the piezoelectric element and its electrodes from the adjacent conductor.

Each of the parallel conductors 11 and 12 apply a total force F upon the associated insulator 18 or 19 and thus upon the electrode-bearing surfaces 14a and 14b of the piezoelectric element. The magnitude of force F, according to Ampere's Law, is given by $F=kLI^2/D$, where k is a constant equal to $2\times10^{-7}N.A^{-2}$. Responsive to the application of oppositely directed forces of magnitude F upon opposite surfaces of the piezoelectric element 14, a voltage V is generated between electrodes 15 and 16. The magnitude of voltage V is given by $V=gZF/S$, where g is the longitudinal piezoelectric constant of element 14, Z is the element thickness and S is the element area subjected to compressive force F, and is equal to $W\times L$. The sensor output voltage is therefore $V=kgZI^2/WD$. Thus, the sensor output voltage is proportional both to the ratio (Z/D) of piezoelectric element thickness to conductor separation and to the square of the current I to be sensed, and is inversely proportional to the piezoelectric element width W. Therefore, for a given geometric configuration, the square root of the average value $V_{avg}$ of the voltage V is proportional to the R.M.S. value of the current I, or $I_{rms} = C\sqrt{V}$, where C is a constant equal to DW/Zkg.

It will be seen that, if the current $I_o$ in one of the conductors 11 or 12 is made constant, then sensor output voltage is proportional to the instantaneous magnitude of the current $I_l$ flow through the other conductor, with $V = k_o I_l = (kgZI_o/DW)I_l$.

Figure 2F:
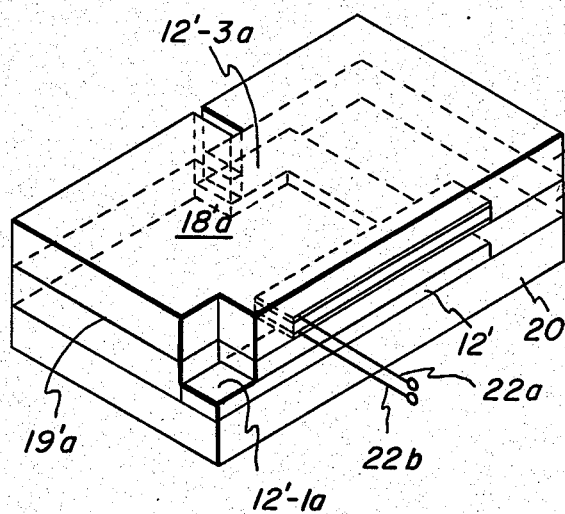
FIGS. 2a-2g are a sequence of perspective views of the steps in the fabrication of the sensor of FIG. 2.
Figure 2G:
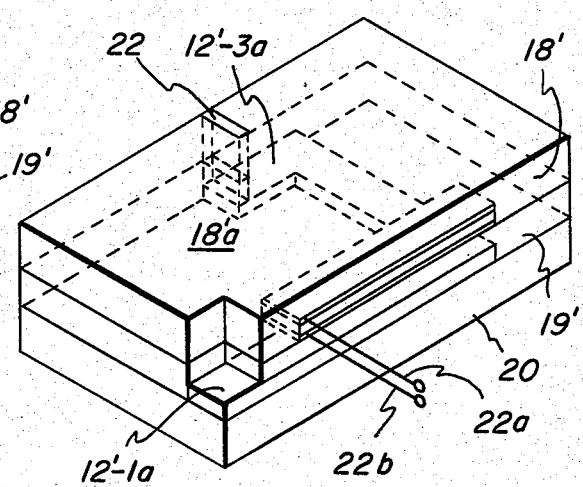
Figure 2:
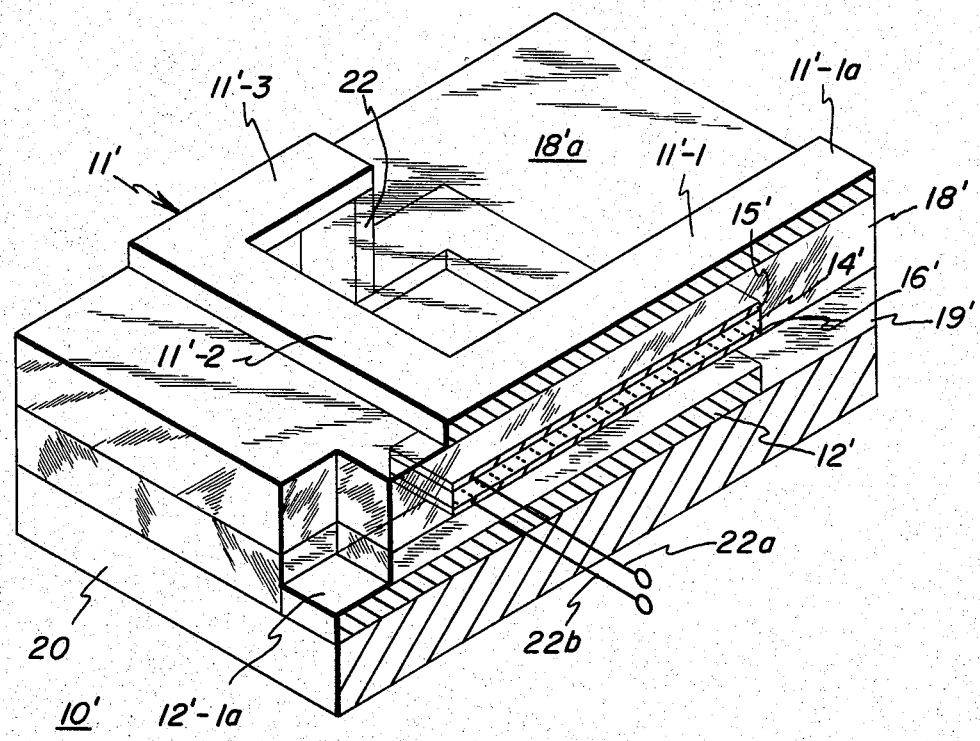
FIG. 2 is a perspective view of an integratable sensor, in accordance with the principles of the present invention.
Figure 2A:
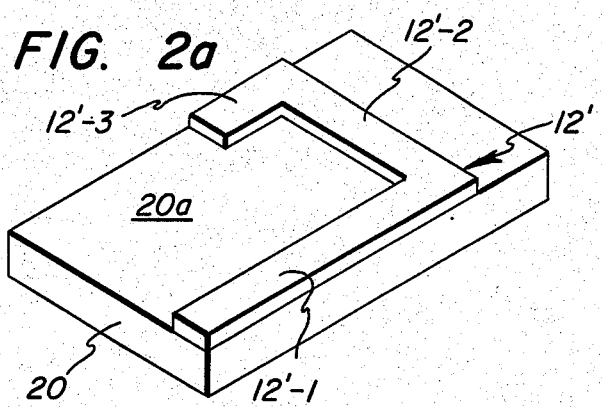
Figure 2B:
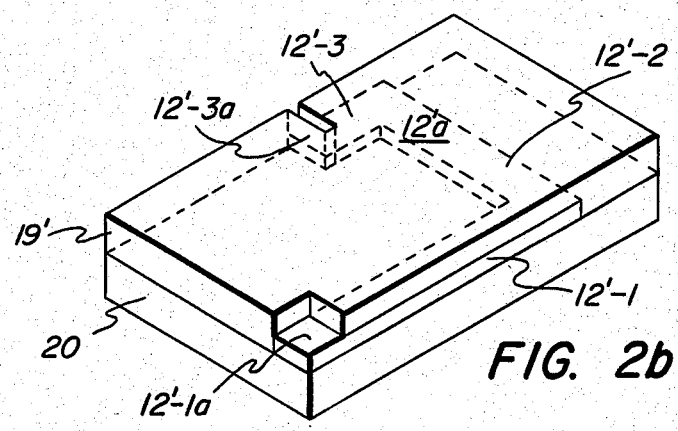
Figure 2C:
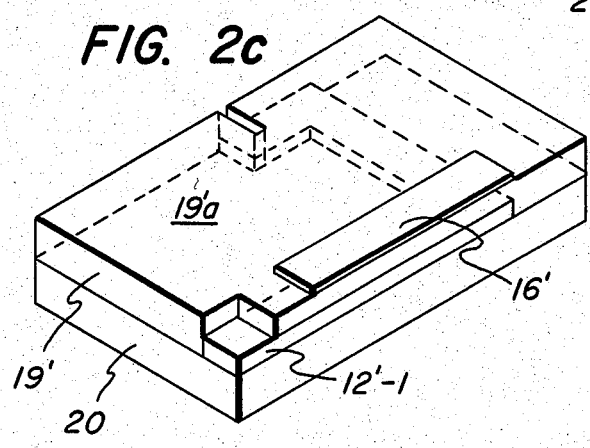
Figure 2D:
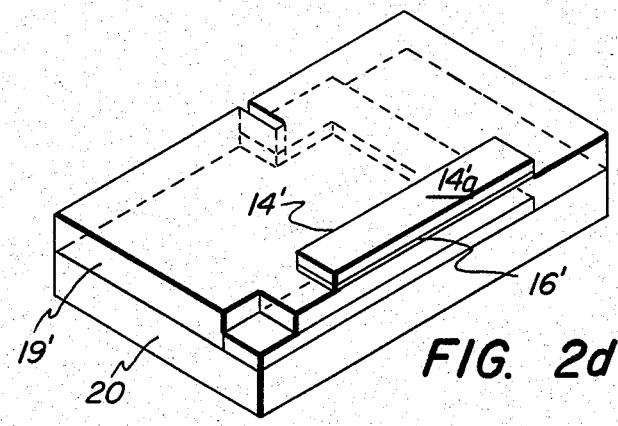

Referring now to FIGS. 2 and 2a–2g, sensor 10 may be fabricated upon an insulative substrate 20, of silicon, ceramic and the like material. In particular, integrated sensor 10' (FIG. 2) is fabricated by depositing a substantially planar "L-shaped" lower conductive element 12' upon a substrate surface 20a (FIG. 2a). Lower conductive member 12' may be fabricated of any conductive material, such as aluminum, copper and the like. Conductor 12' has a longer leg portion 12'-1 connected by a transverse portion 12'-2 to a shorter leg portion 12'-3, spaced from longer leg portion 12'-1. A layer 19' of insulative material (FIG. 2b) is fabricated upon at least upper surface 12'a of the transverse portion 12'-2 and all but the free end portions 12'-1a and 12'-3a of leg portions 12'-1 and 12'-3.

Figure 2E:
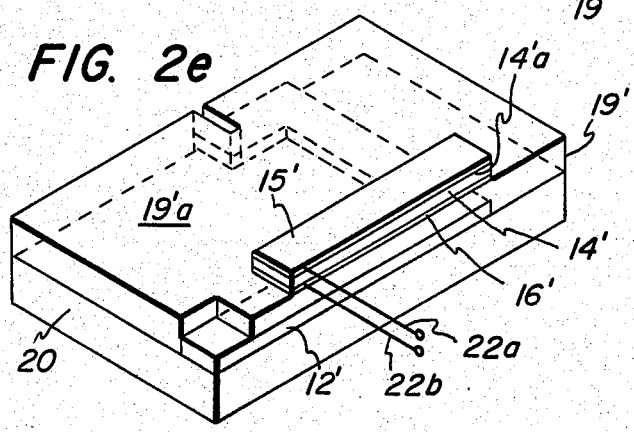

A lower electrode 16' is fabricated (FIG. 2c) on surface 19'a of the insulative layer, over at least part of longer leg portion 12'-1. A piezoelectric element layer 14' is then fabricated (FIG. 2d) upon lower electrode 16'. Advantageously, the piezoelectric element 14' is formed of a piezoelectric material which can be deposited in relatively thin layers of films. Piezoelectric element 14' may be a film of polyvinylidene fluoride (commonly referred to as PVF2), a thin layer of lead zirconate titanate ceramic, and the like. Thereafter, upper electrode layer 15' is fabricated upon the upper surface 14a' of the piezoelectric element (FIG. 2e).

Suitable lead means 22a and 22b are fabricated from electrodes 16' and 15', across a portion of insulative layer surface 19a which is remote and removed from the vicinity of lower conductive member 12'. Another insulative layer 18' is fabricated (FIG. 2f) over both the piezoelectric element-electrode structure and the first insulative layer surface 19'a, except in the regions about leg portion ends 12'-1a and 12'-3a, previously left uncovered by the first insulative layer 19'. A via hole, which was formed through insulative layers 18' and 19' during the fabrication of these insulative layers, is filled by a conductive material deposit 22 therein (FIG. 2g).

A second substantially planar "L-shaped" conductive member 11' is then fabricated upon the second insulative layer surface 18a' (FIG. 2). Member 11' has a longer leg portion 11'-1 fabricated in registration with the piezoelectric element 14' and the first conductor longer leg portion 12'-1. A transverse portion 11'-2 connects the end of leg portion 11'-1, closest to first conductive member end 12'-1a, to a shorter leg portion 11'-3. Shorter leg portion 11'-3 of the second conductive member extends toward first conductive member shorter leg portion 12'-3 and connects to conductive deposit 22 to complete the connection between members 11' and 12'. Current can now flow from a first terminal, at leg end 11'-1a, through member 11', deposit 22 and member 12', to a second terminal at leg end 12'-1a.

The thicknesses of insulative layers 18' or 19' are selected to provide the requisite insulation between the current carrying composite conductor 11'/12' and the piezoelectric element 14'. It will be seen that this embodiment allows the current (introduced into the sensor at one of end portions 11'-1a or 12'-1a and removed from the sensor at the other one of the end portions) to flow in the same direction in both of the conductor longer leg portions 11'-1 and 12'-1, while still providing a sensor capable of fully integratable construction upon a substrate surface 20a.

Illustratively, a sensor 10' having a ratio Z/D of about 0.5 and a conductor width W of about 17 millimeters may be used in conjunction with a PVF2 piezoelectric element, which has a constant g of about $1.74 \times 10^{-1}$ V m N$^{-1}$. Thus, for a current I of about 100 amperes, the sensor will provide an output voltage magnitude of about 10 millivolts, which output voltage magnitude is easily amplified by present operational amplifier circuitry, which can be provided upon the same substrate 20.

It should be understood that the piezoelectric element 14 can be replaced by a piezoresistive element, but that a piezoresistive element will require additional current source and temperature-compensating elements to be used, in manner known to the art. The use of a piezoelectric element thus simplifies the current sensor.

Figure 3:
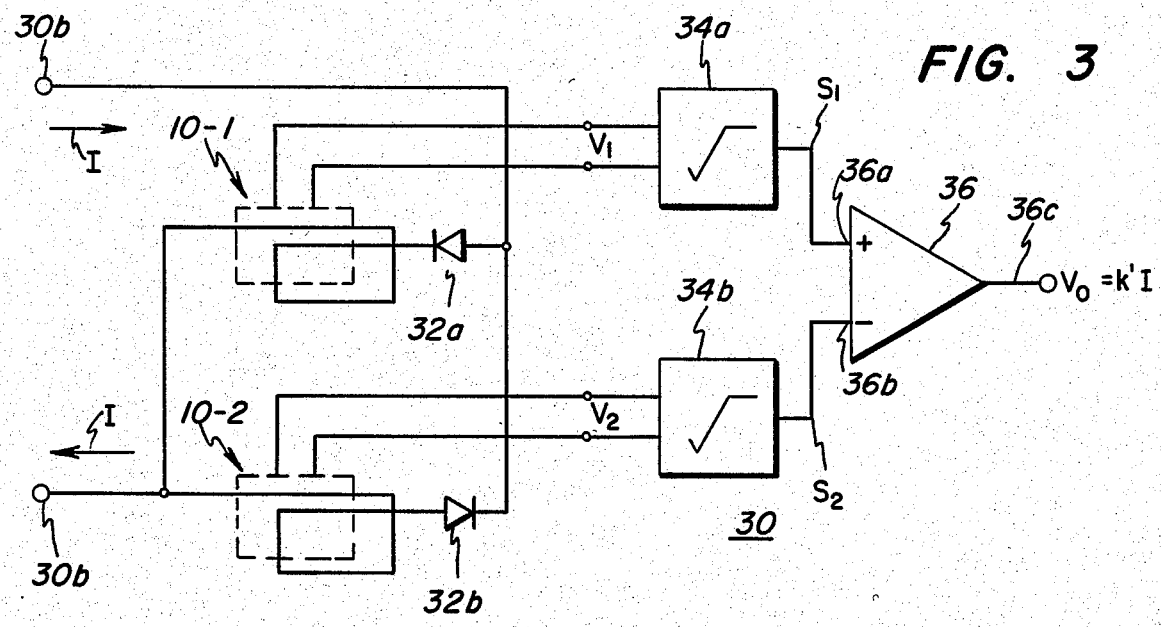
FIG. 3 is a schematic block diagram of an integratable sensor and associated electronics for providing a sensor output voltage proportional to the instantaneous value of total sensor current.

Referring now to FIG. 3, a sensor circuit 30 utilizes a pair of sensors 10-1 and 10-2 to provide an output voltage magnitude $V_0$ which is proportional to the magnitude of current I flowing through the sensors, rather than being proportional to the square of the magnitude of that current as in the basic sensor 10 or 10' itself. Each of sensors 10-1 and 10-2 have a first end of the current-carrying conductor thereof connected in parallel to a first circuit terminal 30a. The remaining end of each sensor conductor is connected through one of a pair of oppositely-poled unidirectionally-conducting means 32a or 32b to another circuit input terminal 30b. Thus, the two sensors are each located in a different side of a half-bridge circuit, with the rectifying elements 32a and 32b allowing conduction of opposite polarities of current I through only opposite ones of the sensors. It should be understood that unidirectionally-conductive elements 32, while shown as diodes, may be equally as well provided by silicon-controlled rectifiers, power MOSFETs and the like devices.

The piezoelectric element voltage output $V_1$ or $V_2$ of each sensor 10-1 or 10-2, is individually operated upon by a square-root circuit 34a or 34b, to provide first and second sensor square-root signals $S_1 = \sqrt{V_1}$ and $S_2 = \sqrt{V_2}$, respectively. The signal $S_2$ is subtracted from signal $S_1$ responsive to respective connection to the non-inverting input 36a and inverting input 36b of an operational amplifier 36. The operational amplifier output 36c provides the circuit output voltage $V_0 = k'I$, where k' is a proportionality constant. Thus, the square-rooted sensor output signals are subtracted from one another in amplifier 36, to provide a circuit output voltage which is proportional to the instantaneous value of the total sensor current I, flowing between circuit terminals 30a and 30b.

While several presently preferred embodiments of my novel current sensor have been described in detail herein, many variations and modifications will now become apparent to those skilled in the art. It is my intent, therefore, to be limited only by the scope of the appending claims, and not by the specific details and instrumentalities presented by way of explanation herein.

What is claimed is:

1. A sensor for measuring the magnitude of an A.C. current, comprising:

first and second conductive members positioned parallel to, and spaced from, one another; said first and second conductive members each having the total and identical A.C. current flowing in the same direction therethrough; and means positioned between said conductive members for non-magnetically generating a signal of magnitude responsive to the magnitude only of a mechanical force generated by the identical current flowing through each of said conductive members.

2. The sensor of claim 1, wherein said generating means includes a piezoresistive member.

3. The sensor of claim 1, wherein said generating means includes a piezoelectric member.

4. The sensor of claim 1, wherein said first conductive member has a first end and a second end, opposite said first end; said second conductive member has a first end, spaced adjacent to the first end of said first conductive member, and a second end, opposite to said second conductive member first end and spaced adjacent to said first conductive member second end; the second end of said first conductive member and the first end of said second conductive member being connected together to cause said A.C. current to be introduced into said sensor at the first end of the first conductive member and to flow from said sensor at the second end of said second conductive member.

5. The sensor of claim 4, further including means for electrically insulating said generating means for each of said conductive members.

6. The sensor of claim 4, wherein said generating means includes a piezoelectric member.

7. The sensor of claim 6, further comprising electrode means formed on said piezoelectric member for providing access to the signal generated thereby.

8. The sensor of claim 6, further comprising means for electrically insulating said piezoelectric member from each of said conductive members.

9. The sensor of claim 8, wherein said insulating means includes first and second rigid insulators, each positioned between a different one of said conductive members and said piezoelectric member.

10. The sensor of claim 6, wherein each of said first and second conductive members is an L-shaped member having a longer leg portion and a shorter leg portion, and said piezoelectric member is parallelly positioned between the longer leg portions.

11. The sensor of claim 10, wherein said piezoelectric member is a layer of a piezoelectric material.

12. The sensor of claim 11, wherein said piezoelectric material is selected from the group consisting of polyvinylidene fluoride and a lead zirconate titanate ceramic.

13. The sensor of claim 1, fabricated directly upon the surface of an insulative substrate.

14. In combination, a pair of the sensors of claim 1; first and second unidirectionally-conducting elements, each in series connection with a second conductor second end of a different sensor and oppositely-poled; the first conductor first ends of both sensors connected in parallel to form a first terminal; the terminals of said first and second unidirectionally-conducting elements furthest from said sensors being connected in parallel to form a second terminal; first and second means, each respectively receiving the signal generated by the generating means of one of the first and second sensors, each for providing a signal varying as the square root of the associated generating means signal; and means for subtracting one of the square-root-varying signals from the other, to provide an output signal of magnitude varying proportional to the magnitude of the current flowing from one to the other of said first and second terminals.

* * * * *